United States Patent
Park et al.

(10) Patent No.: US 12,124,702 B2
(45) Date of Patent: Oct. 22, 2024

(54) SEMICONDUCTOR MEMORY DEVICE CAPABLE OF CONTROLLING A FLOATING STATE OF ADJACENT WORD LINES AND AN OPERATING METHOD THEREOF

(71) Applicant: SAMSUNG ELECTRONICS CO., LTD., Suwon-si (KR)

(72) Inventors: Hyunkook Park, Suwon-si (KR); Sara Choi, Suwon-si (KR)

(73) Assignee: SAMSUNG ELECTRONICS CO., LTD, Suwon-si (KR)

( * ) Notice: Subject to any disclaimer, the term of this patent is extended or adjusted under 35 U.S.C. 154(b) by 13 days.

(21) Appl. No.: 17/941,092

(22) Filed: Sep. 9, 2022

(65) Prior Publication Data

US 2023/0140995 A1    May 11, 2023

(30) Foreign Application Priority Data

Nov. 10, 2021  (KR) .................. 10-2021-0154262
May 11, 2022   (KR) .................. 10-2022-0057796

(51) Int. Cl.
*G06F 3/06*    (2006.01)

(52) U.S. Cl.
CPC .......... *G06F 3/0611* (2013.01); *G06F 3/0629* (2013.01); *G06F 3/0679* (2013.01)

(58) Field of Classification Search
CPC ...... G05B 13/00–048; G05B 15/00–02; G05B 17/00–02; G06F 1/00–3296;

(Continued)

(56) References Cited

U.S. PATENT DOCUMENTS

| 7,180,787 B2 * | 2/2007 | Hosono .............. G11C 16/0483 |
| | | 365/185.11 |
| 7,760,550 B2 | 7/2010 | Fayrushin et al. |
| (Continued) | | |

FOREIGN PATENT DOCUMENTS

KR    10-2021-0099657    8/2021

OTHER PUBLICATIONS

R. Motwani, "Estimation of Flash Memory Level Distributions Using Interpolation Techniques for Optimizing the Read Reference," 2015 IEEE Global Communications Conference (GLOBECOM), San Diego, CA, USA, 2015, pp. 1-6, doi: 10.1109/GLOCOM.2015.7416949. (Year: 2015).*

(Continued)

*Primary Examiner* — Daniel C. Chappell
(74) *Attorney, Agent, or Firm* — F. CHAU & ASSOCIATES, LLC

(57) ABSTRACT

A semiconductor memory device including: first and second memory cells storing multi-bit data; a first word line coupled to the first memory cell; and a second word line connected to the second memory cell and adjacent to the first word line; wherein a period in which a first word line voltage for reading data stored in the first memory cell is applied includes: a first period in which a first voltage level is applied to read first bit data from the multi-bit data stored in the first memory cell; a second period having a second voltage level lower than the first voltage level; and a third period in which a third voltage level higher than the second voltage level is applied to read second bit data from the multi-bit data stored in the first memory cell, wherein in the second period, the second word line is in a floating state.

17 Claims, 13 Drawing Sheets

(58) Field of Classification Search
CPC ............... G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 18/00–41; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | | |
|---|---|---|---|---|
| 8,432,732 B2* | 4/2013 | Li | ............... | G11C 29/028 |
| | | | | 365/185.02 |
| 8,432,737 B2* | 4/2013 | Shiga | ............... | G11C 29/025 |
| | | | | 365/185.21 |
| 8,472,266 B2 | 6/2013 | Khandelwal et al. | | |
| 8,514,630 B2* | 8/2013 | Huynh | ............... | G11C 29/028 |
| | | | | 365/185.21 |
| 9,721,652 B2 | 8/2017 | Puthenthermadam et al. | | |
| 10,573,386 B2* | 2/2020 | Kim | ............... | G11C 16/10 |
| 10,606,518 B2* | 3/2020 | Zeng | ............... | G11C 29/56008 |
| 10,748,617 B2* | 8/2020 | Ko | ............... | G11C 16/3459 |
| 10,943,663 B1 | 3/2021 | Wang et al. | | |
| 11,024,393 B1* | 6/2021 | Zhang | ............... | G11C 16/0483 |
| 11,152,045 B2* | 10/2021 | Cho | ............... | G11C 8/18 |
| 11,199,991 B2* | 12/2021 | Hsu | ............... | G06F 3/0661 |
| 2007/0063739 A1* | 3/2007 | Kim | ............... | H04L 25/0272 |
| | | | | 326/83 |
| 2009/0219765 A1* | 9/2009 | Maejima | ............... | G11C 16/3454 |
| | | | | 365/189.011 |
| 2009/0285026 A1* | 11/2009 | Kang | ............... | G11C 16/08 |
| | | | | 365/185.13 |
| 2011/0235406 A1* | 9/2011 | Jung | ............... | G11C 11/412 |
| | | | | 365/189.011 |
| 2012/0113708 A1* | 5/2012 | Jung | ............... | G11C 11/4125 |
| | | | | 29/825 |
| 2015/0085576 A1* | 3/2015 | Yoo | ............... | G11C 16/26 |
| | | | | 365/185.11 |
| 2017/0110197 A1* | 4/2017 | Park | ............... | G11C 7/12 |
| 2021/0065808 A1* | 3/2021 | Wang | ............... | G11C 16/0483 |
| 2023/0013322 A1* | 1/2023 | Zhou | ............... | G11C 16/10 |

OTHER PUBLICATIONS

M. Bagatin, S. Gerardin, A. Paccagnella and V. Ferlet-Cavrois, "Alpha-induced soft errors in Floating Gate flash memories," 2012 IEEE International Reliability Physics Symposium (IRPS), Anaheim, CA, USA, 2012, pp. 3C.2.1-3C.2.7, doi: 10.1109/IRPS.2012.6241811. (Year: 2012).*

D. Wei, Z. Piao, H. Feng, L. Qiao, C. Hu and X. Peng, "TCSE: A Target Cell States Elimination Coding Strategy for Highly Reliable Data Storage Based on 3-D nand Flash Memory," in IEEE Transactions on Computer-Aided Design of Integrated Circuits and Systems, vol. 41, No. 12, pp. 5299-5312, Dec. 2022. (Year: 2022).*

* cited by examiner

SEMICONDUCTOR MEMORY DEVICE CAPABLE OF CONTROLLING A FLOATING STATE OF ADJACENT WORD LINES AND AN OPERATING METHOD THEREOF

CROSS-REFERENCE TO RELATED APPLICATIONS

This application claims priority under 35 U.S.C. § 119 to Korean Patent Application No. 10-2022-0057796 filed on May 11, 2022, and to Korean Patent Application No. 10-2021-0154262 filed on Nov. 10, 2021, in the Korean Intellectual Property Office, the disclosures of which are incorporated by reference herein in their entireties.

TECHNICAL FIELD

Embodiments of the present disclosure described herein relate to a semiconductor memory device, and more particularly, to a semiconductor memory device capable of controlling a floating state of adjacent word lines and an operating method thereof.

DISCUSSION OF RELATED ART

A semiconductor memory device may be classified as a volatile memory device or a non-volatile memory device. A volatile memory device has high read and write speeds. However, the volatile memory device may no not retain its stored in the absence of power. On the other hand, the nonvolatile memory device may retain its stored data even in the absence of power. The nonvolatile memory device may thus be used to retain data in devices that tend to be powered off.

A typical example of a nonvolatile memory device is a flash memory. Flash memory erases data in units of blocks and rewrites data at the byte level. The flash memory is widely used in user terminals such as computers and smart phones, and storage media such as Universal Serial Bes (USB) and memory cards. The flash memory may store one or more multi-bit data in one memory cell. The flash memory that stores multi-bit data requires voltage levels of select read voltages to be equal to the number of program states.

The flash memory may have a pre-emphasis period in the middle of changing the read voltage level to quickly change the level of the select read voltage. The flash memory requires a different pre-emphasis voltage level for each pre-emphasis period. Accordingly, the flash memory may require a large number of e-fuses to set the pre-emphasis voltage levels. Due to this, the chip size of the flash memory may increase. In addition, in the flash memory, post-processing time after wafer fabrication may increase due to the complexity of the eFuse circuit.

SUMMARY

Embodiments of the present disclosure provide a semiconductor memory device including: first and second memory cells that store multi-bit data; a first word line coupled to the first memory cell; and a second word line connected to the second memory cell and adjacent to the first word line; wherein a period in which a first word line voltage for reading data stored in the first memory cell is applied includes: a first period in which a first voltage level is applied to read first bit data from the multi-bit data stored in the first memory cell; a second period having a second voltage level lower than the first voltage level; and a third period in which a third voltage level higher than the second voltage level is applied to read second bit data from the multi-bit data stored in the first memory cell, wherein in the second period, the second word line is in a floating state.

Embodiments of the present disclosure provide a semiconductor memory device including: first and second memory cells for storing multi-bit data; a first word line coupled to the first memory cell; a second word line connected to the second memory cell and adjacent to the first word line; a voltage generator for generating a second word line voltage provided to the second word line; and a word line connect circuit connected between the voltage generator and the second word line; wherein a period in which a first word line voltage for reading data stored in the first memory cell is applied includes: a first period in which a first voltage level is applied to read first bit data from the multi-bit data stored in the first memory cell; a second period having a second voltage level lower than the first voltage level; and a third period in which a third voltage level higher than the second voltage level is applied to read second bit data from the multi-bit data stored in the first memory cell, wherein the second word line voltage provided to the second word line is cut off in the second period.

Embodiments of the present disclosure provide a method of operating a semiconductor memory device, the semiconductor memory device including first and second memory cells for storing multi-bit data, a first word line coupled to the first memory cell, and a second word line connected to the second memory cell and adjacent to the first word line, the method including: applying a first voltage to the first word line to read first bit data from the multi-bit data stored in the first memory cell; applying a second voltage lower than the first voltage; and applying a third voltage higher than a second voltage to the first word line to read second bit data from the multi-bit data stored in the first memory cell, wherein the second word line is in a floating state when the second voltage is applied.

BRIEF DESCRIPTION OF THE FIGURES

The above and other features of the present disclosure will become apparent by describing in detail embodiments thereof with reference to the accompanying drawings.

DETAILED DESCRIPTION OF THE EMBODIMENTS

Figure 1:
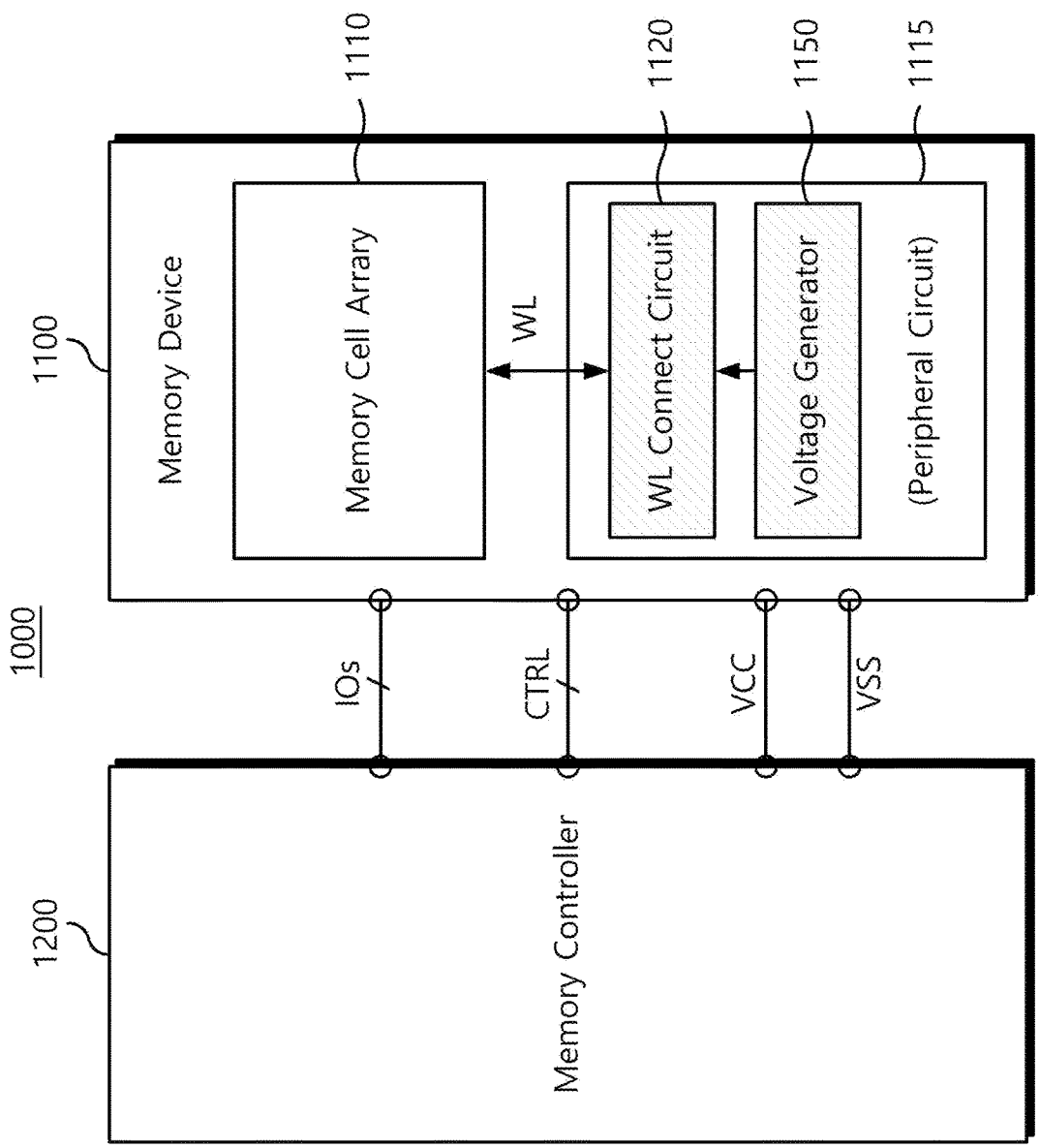
FIG. 1 is a block diagram illustrating a data storage device according to an embodiment of the present disclosure.

Hereinafter, embodiments of the present disclosure will be described with reference to the accompanying drawings. In the following description, the same elements may be designated by the same reference numerals although they are shown in different drawings.

FIG. 1 is a block diagram illustrating a data storage device according to an embodiment of the present disclosure. Referring to FIG. 1, the data storage device 1000 includes a semiconductor memory device 1100 and a memory controller 1200. The semiconductor memory device 1100 and the memory controller 1200 may be connected through data input/output lines IOs, control lines CTRL, and power lines VCC and VSS. The data storage device 1000 may store data in the semiconductor memory device 1100 under the control of the memory controller 1200.

The semiconductor memory device 1100 includes a memory cell array 1110 and a peripheral circuit 1115. The memory cell array 1110 includes a plurality of memory cells, and multi-bit data may be stored in each memory cell.

The memory cell array 1110 may include a plurality of memory blocks. Each memory block may have a planar two-dimensional structure or a vertical three-dimensional structure. The memory cell array 1110 may be located next to or above the peripheral circuit 1115 according to a circuit structure. A structure in which the memory cell array 1110 is located on the peripheral circuit 1115 is referred to as a cell on peripheral (COP) structure.

The peripheral circuit 1115 may generate internal power of various levels and provide word line voltages to word lines WL connected to the memory cell array 1110. The peripheral circuit 1115 may receive commands, addresses, and data from the memory controller 1200, and store data in the memory cell array 1110 through an internal operation. In addition, the peripheral circuit 1115 may read data stored in the memory cell array 1110 and provide the read data to the memory controller 1200.

The peripheral circuit 1115 may include a word line connect circuit 1120 and a voltage generator 1150. The word line connect circuit 1120 may be positioned between the word lines WL and the voltage generator 1150, and provide a word line voltage generated by the voltage generator 1150 to at least one of the word lines WL. When the word line connect circuit 1120 is turned off, the word lines WL may be in a floating state. The voltage generator 1150 may receive external power through the power lines VCC and VSS and generate internal power required for internal operations such as reading or writing.

Figure 2:
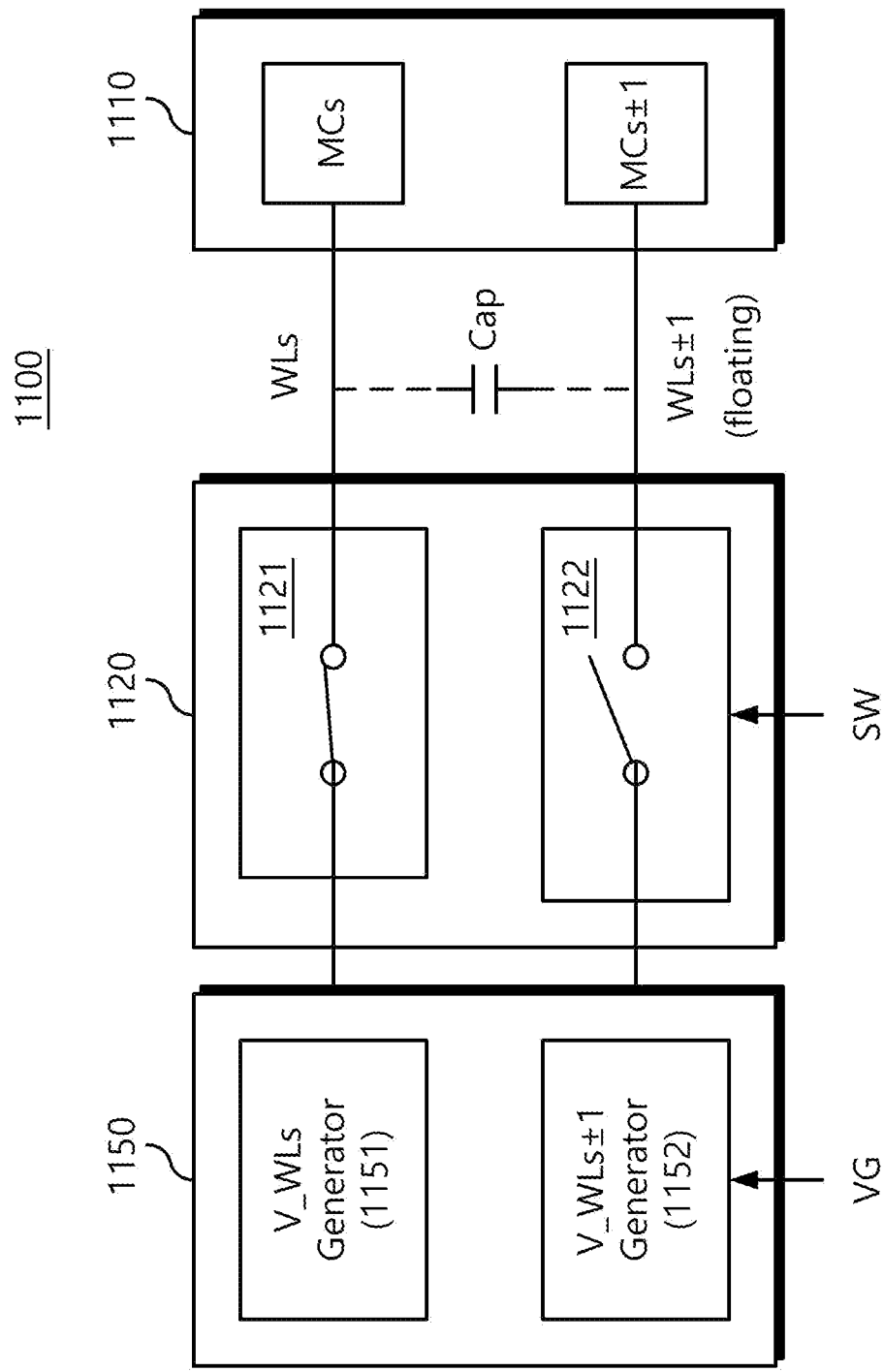
FIG. 2 is a block diagram illustrating the semiconductor memory device shown in FIG. 1.

FIG. 2 is a block diagram illustrating the semiconductor memory device shown in FIG. 1. Referring to FIG. 2, a selected word line WLs is connected to selected memory cell MCs, and an adjacent word line WLs±1 is connected to the adjacent memory cell MCs±1. Here, MCs±1 may mean MCs+1 or MCs−1. In addition, WLs±1 may mean WLs+1 or WLs−1. Further, WLs±1 may mean one adjacent word line group. For example, WLs±1, WLs±2, WLs±3, etc. may also be included in the adjacent word line group.

A coupling capacitance Cap may exist between the selected word line WLs and the adjacent word line WLs±1. The coupling capacitance Cap may increase as the spacing between word lines WL decreases. In addition, the coupling capacitance Cap may increase as a voltage change between the word lines WL increases.

The word line connect circuit 1120 may connect the memory cell array 1110 and the voltage generator 1150 through the word lines WL. The selected word line connect circuit 1121 may be connected to the selected word line WLs, and the adjacent word line connect circuit 1122 may be connected to the adjacent word lines WLs±1. The word line connect circuit 1120 may include a switch circuit capable of blocking the word line connection by a switch signal SW. When the connection of the adjacent word lines WLs±1 is cut off by the switch signal SW, the adjacent word lines WLs±1 may be in a floating state. For example, when the switch circuit is opened by the switch signal SW, the adjacent word lines WLs±1 enter the floating state.

The voltage generator 1150 may include a select word line voltage generator 1151 and an adjacent word line voltage generator 1152. The select word line voltage generator 1151 may be connected to the selected word line connect circuit 1121 and may provide a selected word line voltage V_WLs to the selected word line WLs. The adjacent word line voltage generator 1152 may be connected to the adjacent word line connect circuit 1122 and may provide an adjacent word line voltage V_WLs±1 to the adjacent word line WLs±1. The voltage generator 1150 may be turned off by a voltage generation signal VG. When the adjacent word line voltage generator 1152 is turned off by the voltage generation signal VG, the adjacent word line WLs±1 may be in a floating state.

The semiconductor memory device 1100 may connect or disconnect the adjacent word line WLs±1 by the switch signal SW or the voltage generation signal VG provided to the word line connect circuit 1120 or the voltage generator 1150. A state in which the adjacent word line WLs±1 is connected to the adjacent memory cell MCs±1 is called a biased state, and a disconnected state of the adjacent word line WLs±1 is called a floating state.

Figure 3:
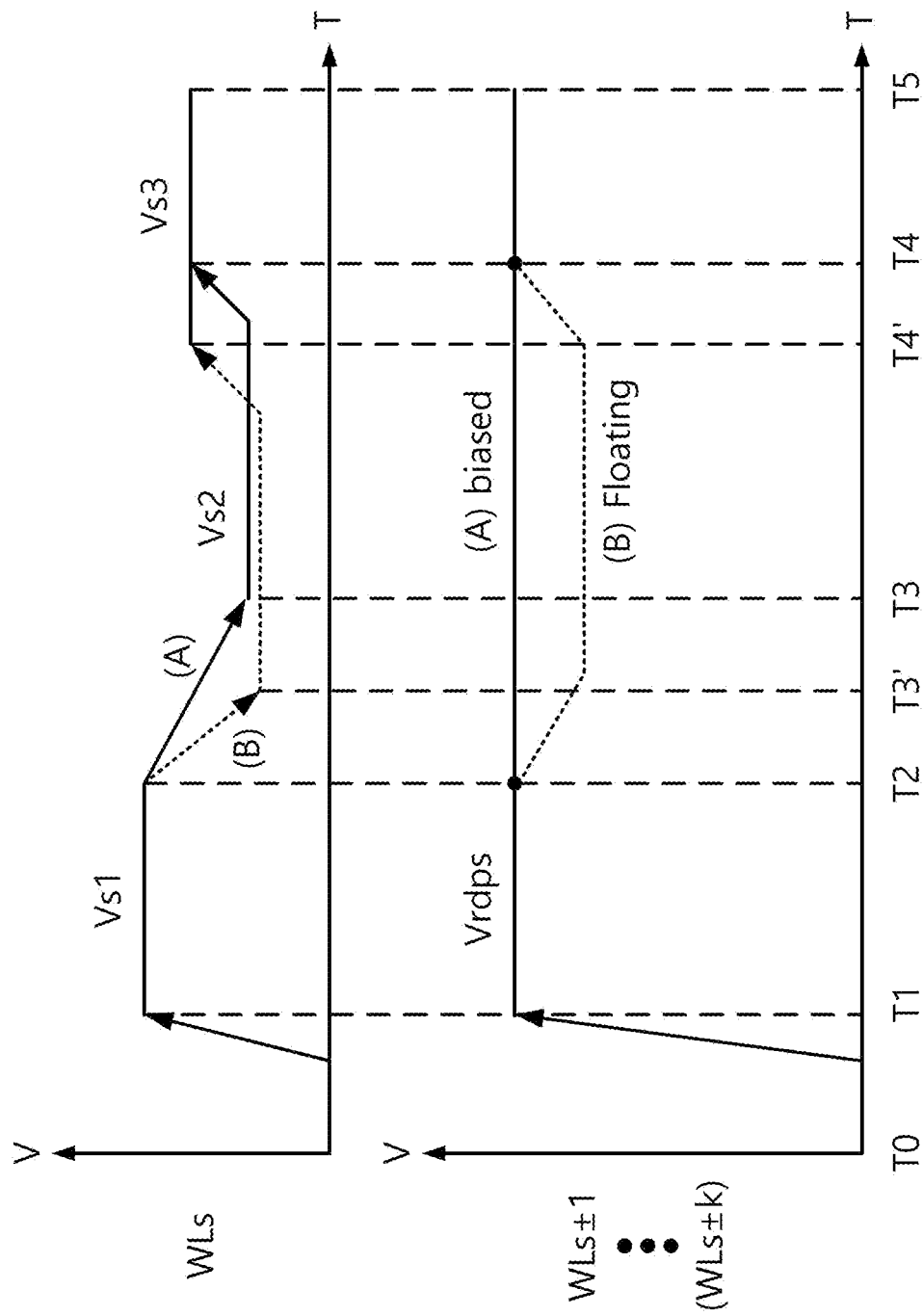
FIG. 3 is a timing diagram for explaining a read operation of the semiconductor memory device shown in FIG. 2.

FIG. 3 is a timing diagram for explaining a read operation of the semiconductor memory device shown in FIG. 2. FIG. 3 shows the word line voltage levels provided to the selected word line WLs and the adjacent word line WLs±1 to read multi-bit data stored in the selected memory cells MCs.

In FIG. 3, the adjacent word line WLs±1 may be WLs+1 or WLs−1. In addition, the adjacent word line WLs±1 may be referred to as one adjacent word line group. For example, WLs±1, WLs±2, ..., WLs±k (k is a natural number greater than or equal to 3) may also be included in the adjacent word line group. Hereinafter, it will be described that the adjacent word line is WLs+1 or WLs−1.

In FIG. 3, (A) shows a state in which the adjacent word lines WLs±1 are connected, in other words, a biased state. (B) shows a state in which the adjacent word lines WLs±1 are cut off, in other words, a floating state.

Referring to biased state (A) of FIG. 3, the period in which the selected word line voltage is applied to the selected word line WLs includes first to third periods. In the first period T1 to T2, a first voltage level Vs1 is applied to read the first bit data among the multi-bit data. In the second period T2 to T4, a second voltage level Vs2 lower than the first voltage level Vs1 is applied. In the third period T4 to T5, a third voltage level Vs3 higher than the second voltage level Vs2 is applied to read the second bit data. The third voltage level Vs3 may be lower than the first voltage level Vs1. During a period in which the select read voltage is applied to the selected word line WLs, a read pass voltage Vrdps may be provided to the adjacent word lines WLs±1.

The voltage level of the selected word line WLs may be the first voltage level Vs1 at the time T1. The voltage level of the selected word line WLs may be changed from the first voltage level Vs1 to the second voltage level Vs2 at time T2. The time taken for the voltage level of the selected word line WLs to change from the first voltage level Vs1 to the second voltage level Vs2 may be T3–T2. As the distance between the selected word line WLs and the adjacent word line WLs±1 decreases, the coupling capacitance Cap between the selected word line WLs and the adjacent word line WLs±1 may increase. In addition, as the voltage difference between the first voltage level Vs1 and the second voltage level Vs2 increases, the coupling capacitance Cap between the selected word line WLs and the adjacent word line WLs±1 may increase. In other words, when the voltage difference between the read pass voltage Vrdps and the first voltage level Vs1 (Vrdps–Vs1) is greater than the voltage difference between the read pass voltage Vrdps and the second voltage level Vs2 (Vrdps–Vs2), the selected word line WLs may be more affected by the coupling capacitance Cap.

The semiconductor memory device 1100 may disconnect the adjacent word line connect circuit (see FIG. 2, 1122) or turn off the adjacent word line voltage generator (see FIG. 2, 1152). In this case, the adjacent word line WLs±1 may be in the floating state (B) in the second period T2 to T4. When the adjacent word line WLs±1 is in the floating state, the voltage level of the adjacent word line WLs±1 may have a waveform similar to the selected word line voltage due to capacitive coupling. Accordingly, the selected word line WLs may be less affected by the coupling capacitance Cap.

If the adjacent word line WLs±1 is in the floating state B in the second period T2 to T4, the time point at which the voltage level of the selected word line WLs changes from the first voltage level Vs1 to the second voltage level Vs2 may be earlier from T3 to T3'. In addition, a word line setup time during which the voltage level of the selected word line WLs is changed from the first voltage level Vs1 to the third voltage level Vs3 may be reduced from T4-T2 to T4'-T2.

The semiconductor memory device 1100 may put the adjacent word line WLs±1 in a floating state. When the adjacent word line WLs±1 is in the floating state, the voltage level of the adjacent word line WLs±1 may have a waveform similar to that of the selected word line voltage V_WLs due to capacitive coupling. The selected word line WLs may be less affected by the coupling capacitance Cap. According to embodiments the present disclosure, it is possible to reduce the voltage level setup time of the selected word line WLs during a read operation.

Figure 4:
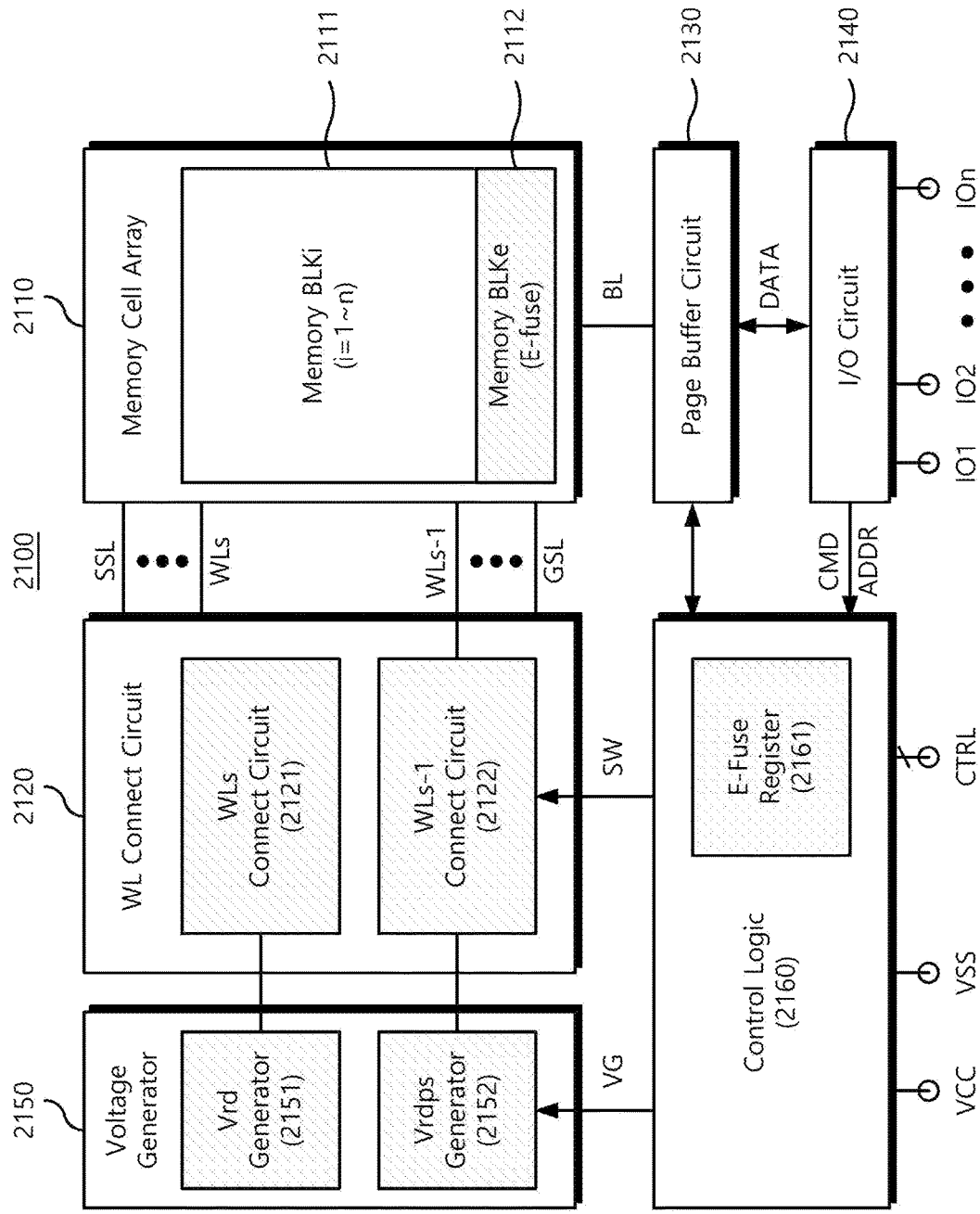
FIG. 4 is a block diagram illustrating a flash memory according to an embodiment of the present disclosure.

The semiconductor memory device 1100 according to an embodiment of the present disclosure may be applied to a nonvolatile memory (NVM) in which multi-bit data is stored and a read voltage level is changed during a read operation. The nonvolatile memory (NVM) may include ferroelectric random access memory (FRAM), phase change RAM (PRAM), magnetoresisitive RAM (MRAM), resistive RAM (RRAM), flash memory, and the like. Hereinafter, an operation method of the semiconductor memory device 1100 described with reference to FIGS. 1 to 3 will be described in detail using a vertical NAND flash memory (VNAND) having a vertically stacked structure among NVMs FIG. 4 is a block diagram illustrating a flash memory according to an embodiment of the present disclosure. Referring to FIG. 4, the flash memory 2100 includes a memory cell array 2110, a word line connect circuit 2120, a page buffer circuit 2130, a data input/output circuit 2140, a voltage generator 2150, and control logic 2160.

The memory cell array 2110 may include memory blocks 2111 (BLK1 to BLKn) for storing user data and an eFuse memory block 2112 (BLKe) for storing eFuse data. The eFuse data stored in the eFuse memory block 2112 may be loaded into the control logic 2160 when the flash memory 2100 is booted. The eFuse data may be used to set various operating voltages or operating times of the flash memory 2100.

The memory block BLK1 may be formed in a direction perpendicular to a substrate. A gate electrode layer and an insulating layer may be alternately deposited on the substrate. An information storage layer may be formed between the gate electrode layer and the insulating layer. The information storage layer may include a tunnel insulation layer, a charge trap layer, and a blocking insulation layer. The gate electrode layer of the memory block BLK1 may be connected to a ground selection line GSL, a plurality of word lines WL, and a string selection line SSL.

The word line connect circuit 2120 may connect the memory cell array 2110 and the voltage generator 2150 through the word lines WL. The word line connect circuit 2120 may receive operating voltages such as a select read voltage Vrd or a read pass voltage Vrdps from the voltage generator 2150 and provide these voltages as wordline voltages. A selected word line connect circuit 2121 may be connected to the selected word line WLs, and an adjacent word line connect circuit 2122 may be connected to the adjacent word line WLs-1.

The word line connect circuit 2120 may receive the switch signal SW from the control logic 2160. The adjacent word line connect circuit 2122 may be connected or disconnected by the switch signal SW. When the adjacent word line connecting circuit 2122 is disconnected, the adjacent word line WLs-1 may be in a floating state.

The page buffer circuit 2130 may be connected to the memory cell array 2110 through bit lines BL. The page buffer circuit 2130 may temporarily store data to be programmed in a selected page or data read from the selected page. The page buffer circuit 2130 may include a page buffer connected to each bit line. Each page buffer may include a first latch for storing the first bit data and a second latch for storing the second bit data while reading the multi-bit data.

The input/output circuit 2140 may be internally connected to the page buffer circuit 2130 through data lines, and externally connected to the memory controller (refer to FIG. 1, 1200) through input/output lines IO1 to IOn.

The input/output circuit 2140 may receive program data from the memory controller 1200 during a program operation, and may provide read data to the memory controller 1200 during a read operation.

The voltage generator 2150 may receive power from the memory controller 1200 and generate word line voltages required to read or write data. The word line voltages may be provided to the word line through the word line connect circuit 2120. The voltage generator 2150 may generate a program voltage Vpgm provided to the selected word line WLs and a pass voltage Vpass provided to unselected word lines WLu during a program operation. In addition, the voltage generator 2150 may generate a select read voltage Vrd provided to the selected word line WLs and a read pass voltage Vrdps provided to the unselected word lines WLu during a read operation.

The voltage generator 2150 may include a select read voltage generator 2151 and a read pass voltage generator 2152. The select read voltage generator 2151 may generate the select read voltage Vrd provided to the select word line WLs. The read pass voltage generator 2152 may generate the read pass voltage Vrdps provided to the adjacent word line WLs−1 during a read operation. Here, the read pass voltage Vrdps may be a voltage sufficient to turn on the memory cells connected to the unselected word line WLu during a read operation.

The control logic 2160 may control program, read, and erase operations of the flash memory 2100 using commands CMD, addresses ADDR, and control signals CTRL provided from the memory controller 1200. The address ADDR may include a block select address BLK_ADDR for selecting a memory block and a page select address for selecting one page. The control logic 2160 may include an eFuse register 2161.

The eFuse resistor 2161 may generate parameters for controlling various bias conditions of the operating voltage generated by the voltage generator 2150. The eFuse register 2161 may generate parameter signals using eFuse data provided from the eFuse memory block 2112 during a booting operation of the flash memory 2100. In addition, the eFuse register 2161 may generate the switch signal SW provided to the word line connect circuit 2120 and the voltage generation signal VG provided to the voltage generator 2150 by using the eFuse data.

The flash memory 2100 may provide a first voltage level to the selected word line WLs to read a first bit data among multi-bit data, and then provide a second voltage level to read a second bit data. In other words, the flash memory 2100 may change the read voltage level provided to the selected word line WLs from the first voltage level (e.g., Vs1) to the second voltage level (e.g., Vs2) during the read operation.

The flash memory 2100 may provide the switch signal SW to the adjacent word line connect circuit 2122 to put the adjacent word line WLs−1 into a floating state when the read voltage is changed. When the read voltage is changed to the floating state, the adjacent word line WLs−1 may have a voltage waveform similar to that of the selected word line WLs voltage due to capacitive coupling. For this reason, according to embodiments of the present disclosure, the selected word line WLs may be less affected by the coupling capacitance Cap. Furthermore, the flash memory 2100 may put the adjacent word line WLs−1 in a floating state by turning off the read pass voltage generator 2152.

Figure 5:
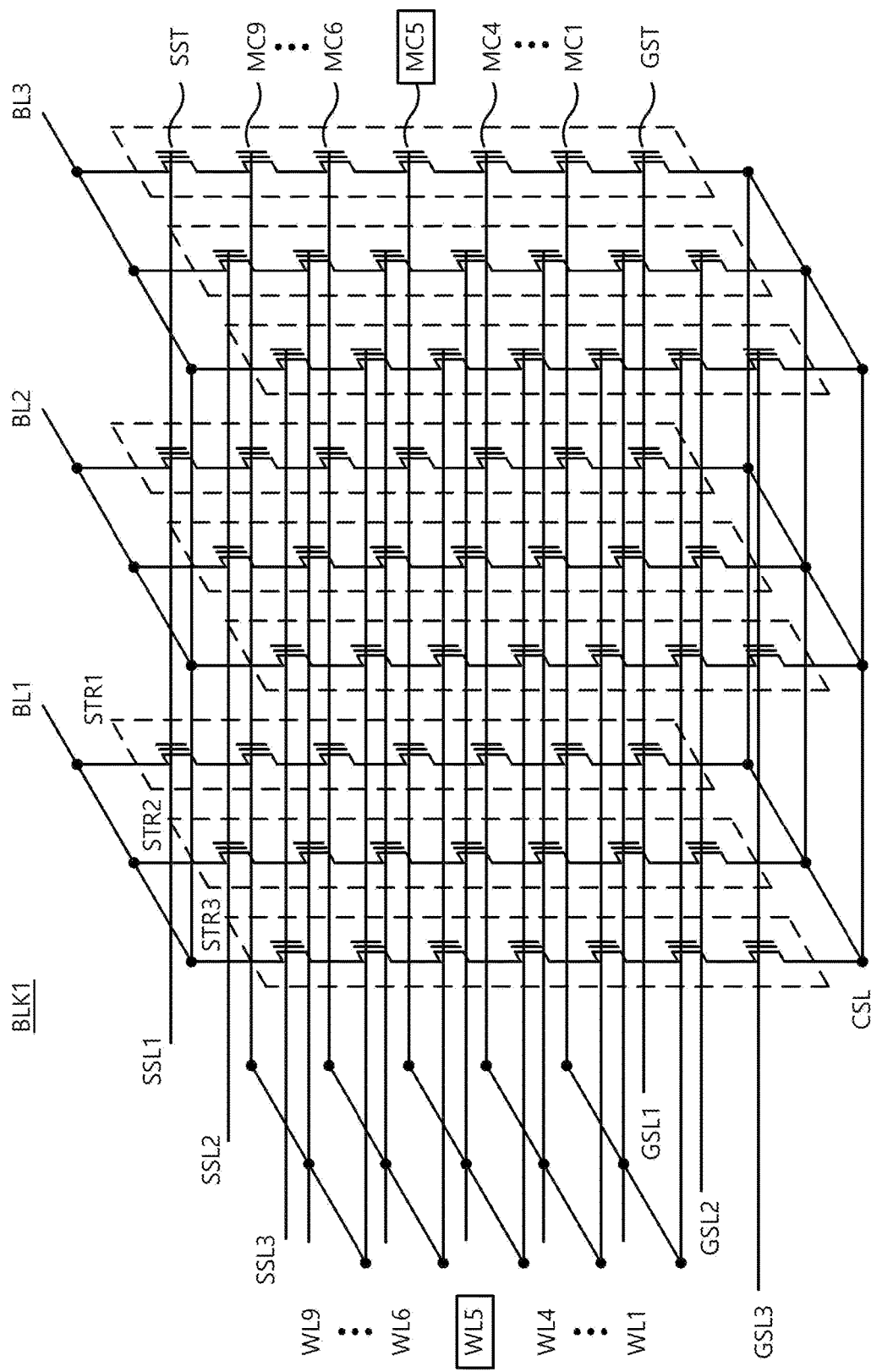
FIG. 5 is a circuit diagram illustrating a memory block of the memory cell array shown in FIG. 4.

FIG. 5 is a circuit diagram illustrating a memory block BLK1 of the memory cell array shown in FIG. 4. In the memory block BLK1, a plurality of cell strings STR1, STR2 and STR3 are formed between the bit lines BL1, BL2 and BL3 and the common source line CSL. Each cell string includes a string select transistor SST, a plurality of memory cells MC1, MC2, MC3, MC4, MC5, MC6, MC7, MC8 and MC9, and a ground select transistor GST.

The string selection transistors SST are connected to the string selection lines SSL1 to SSL3. The ground selection transistors GST are connected to the ground selection lines GSL1 to GSL3. The string select transistors SST are connected to the bit lines BL1 to BL3, and the ground select transistors GST are connected to the common source line CSL.

The plurality of memory cells MC1 to MC9 are connected to a plurality of word lines WL1, WL2, WL3, WL4, WL5, WL6, WL7, WL8 and WL9. The first word line WL1 may be positioned on ground selection lines GSL1, GSL2 and GSL3. First memory cells MC1 at the same height from the substrate may be connected to the first word line WL1. The fourth memory cells MC4 at the same height from the substrate may be connected to the fourth word line WL4. Similarly, the sixth memory cells MC6 and the ninth memory cells MC9 may be connected to the sixth word line WL6 and the ninth word line WL9, respectively.

A selected word line WL5 may be positioned between the fourth word line WL4 and the sixth word line WL6. Memory cells MC5 at the same height from the substrate may be connected to the selected word line WL5. Here, the fourth word line WL4 and the sixth word line WL6 may be adjacent word lines, and the fourth memory cells MC4 and the sixth memory cells MC6 may be adjacent memory cells.

Figure 6:
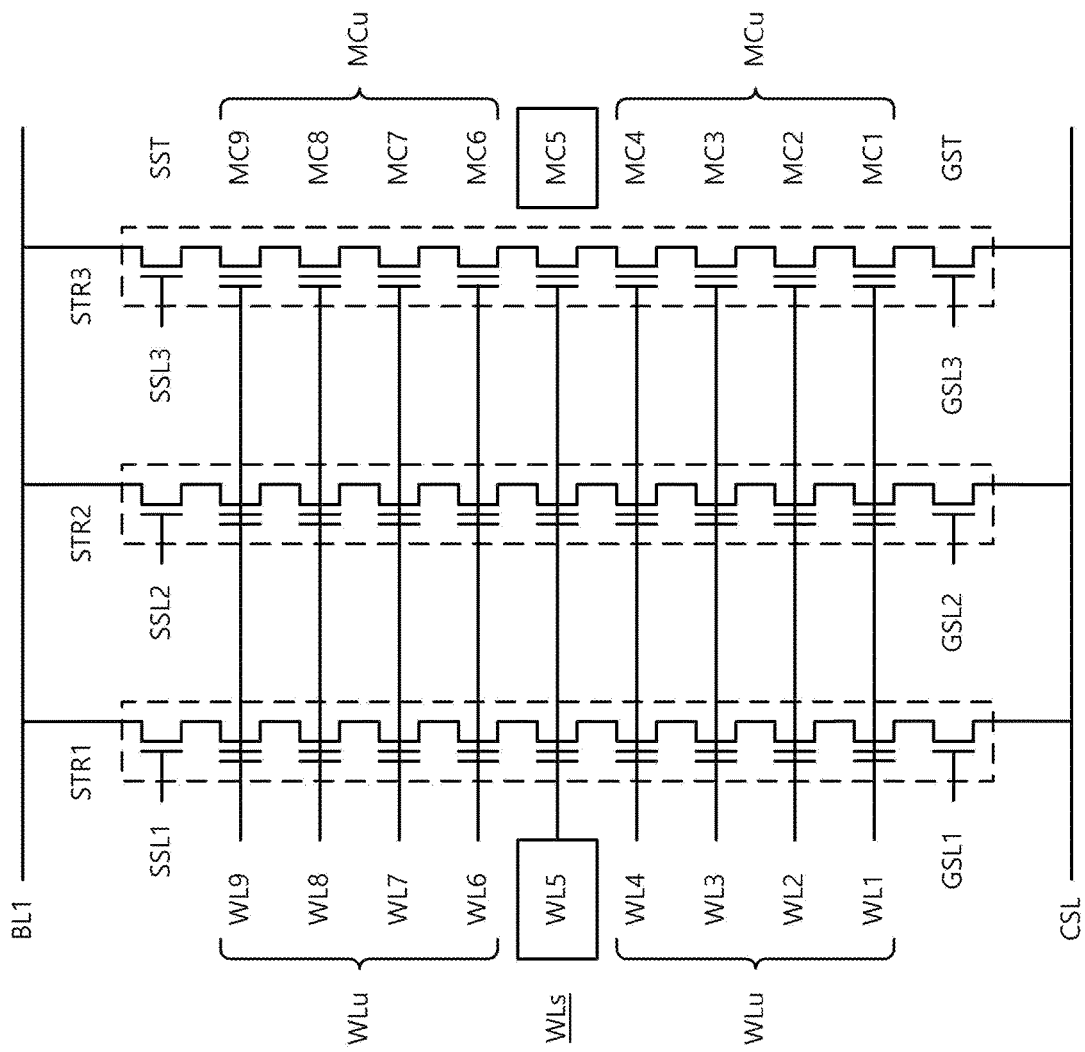
FIG. 6 is a circuit diagram illustrating cell strings connected to one bit line and a common source line among the cell strings of the memory block shown in FIG. 5.

FIG. 6 is a circuit diagram illustrating cell strings STR1 to STR3 connected to one bit line BL1 and a common source line CSL among the cell strings of the memory block BLK1 shown in FIG. 5. The cell strings STR1 to STR3 include the string selection transistors SST selected by the string selection lines SSL1 to SSL3 and a plurality of memory cells MC1 to MC9 controlled by the plurality of word lines WL1 to WL9, and ground select transistors GST selected by the ground select lines GSL1 to GSL3.

The fifth word line WL5 may be a selected word line WLs. The fifth memory cells MC5 may be selected memory cells MCs. The first to fourth word lines WL1 to WL4 may be unselected word lines WLu. The first to fourth memory cells MC1 to MC4 are unselected memory cells MCu. Similarly, the sixth to ninth word lines WL6 to WL9 may be unselected word lines WLu. In addition, the sixth to ninth memory cells MC6 to MC9 may be unselected memory cells MCu.

A program may proceed in the direction of the fourth word line WL4 based on the selected word line WLs. Such a program method is called a T2B (top to bottom) program. The program may proceed in the direction of the sixth word line WL6 based on the selected word line WLs. Such a program method is called a B2T (bottom to top) program. The program may be performed in both directions of the fourth word line WL4 and the sixth word line WL6 based on the selected word line WLs.

Based on the selected word line WLs, the fourth word line WL4 or the sixth word line WL6 through which the program is performed before and after the selected word line WLs is referred to as an adjacent word line. The fourth memory cells MC4 and the sixth memory cells MC6 connected to the adjacent word lines WL4 and WL6 are adjacent memory cells.

During a read operation, the select read voltage Vrd may be provided to the selected word line WLs (WL5), and the read pass voltage Vrdps may be provided to the unselected word lines WLu (WL1 to WL4, WL6 to WL9). The selected word line WLs may be adjacent to the adjacent word lines WL4 and WL6, and the adjacent word lines WL4 and WL6 may be adjacent to the next adjacent word lines WL3 and WL7, respectively. The adjacent memory cells MC4 and MC6 may be connected to the adjacent word lines WL4 and WL6, respectively. The next adjacent memory cells MC3 and MC7 may be connected to the next adjacent word lines WL3 and WL7, respectively.

Figure 7:
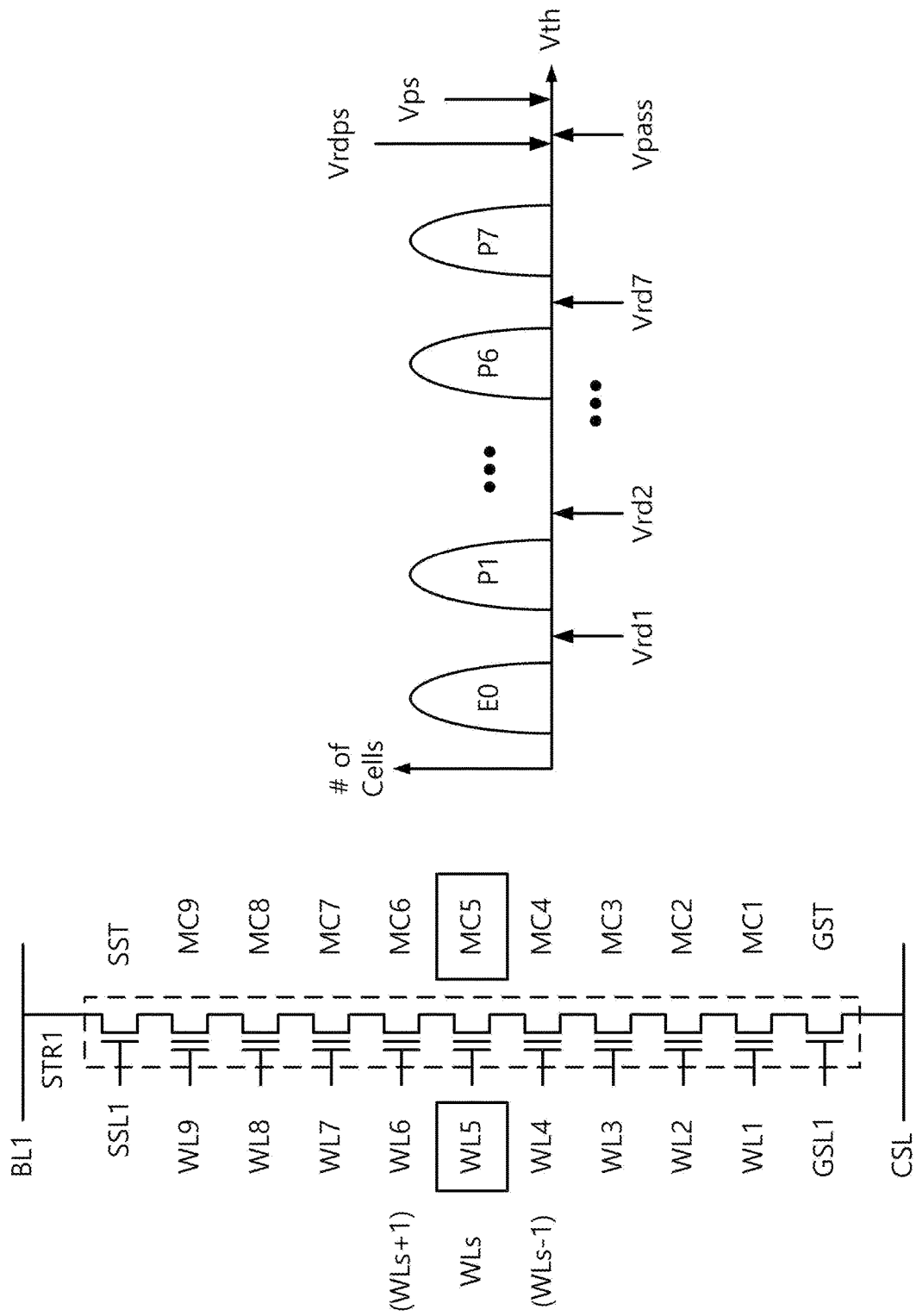
FIG. 7 is a diagram illustrating a threshold voltage distribution of the memory cells shown in FIG. 6.

FIG. 7 is a diagram illustrating a threshold voltage distribution of the memory cells shown in FIG. 6. The horizontal axis represents the threshold voltage Vth, and the vertical axis represents the number of cells. FIG. 7 shows an example in which 3-bit data is stored in one memory cell. The 3-bit memory cell may have one of eight states E0 and P1, P2, P3, P4, P5, P6 and P7 according to a threshold voltage distribution. Here, E0 denotes an erase state, and P1 to P7 denote program states.

During a read operation, select read voltages Vrd1, Vrd2, Vrd3, Vrd4, Vrd5, Vrd6 and Vrd7 may be provided to the selected word line WLs, and the pass voltage Vps or the read pass voltage Vrdps may be provided to the unselected word lines WLu. The pass voltage Vps or the read pass voltage Vrdps may be a voltage sufficient to turn on the memory cells.

The first select read voltage Vrd1 has a voltage level between the erase state E0 and the first program state P1, and the second select read voltage Vrd2 is between the first and second program states P1 and P2. In this way, the seventh select read voltage Vrd7 has a voltage level between the sixth and seventh program states P6 and P7.

When the first select read voltage Vrd1 is applied, the memory cells having the erase state E0 are on-cells and the memory cells having the first to seventh program states P1 to P7 are off-cells. When the second select read voltage Vrd2 is applied, the memory cells having the erase state E0 and the first program state P1 are on-cells. The memory cells having the second to seventh program states P2 to P7 are off cells. In this way, when the seventh select read voltage Vrd7 is applied, the memory cells having the erase state E0 and the first to sixth program states P1 to P6 are on cells. The memory cells having the seventh program state P7 are off cells.

Figure 8:
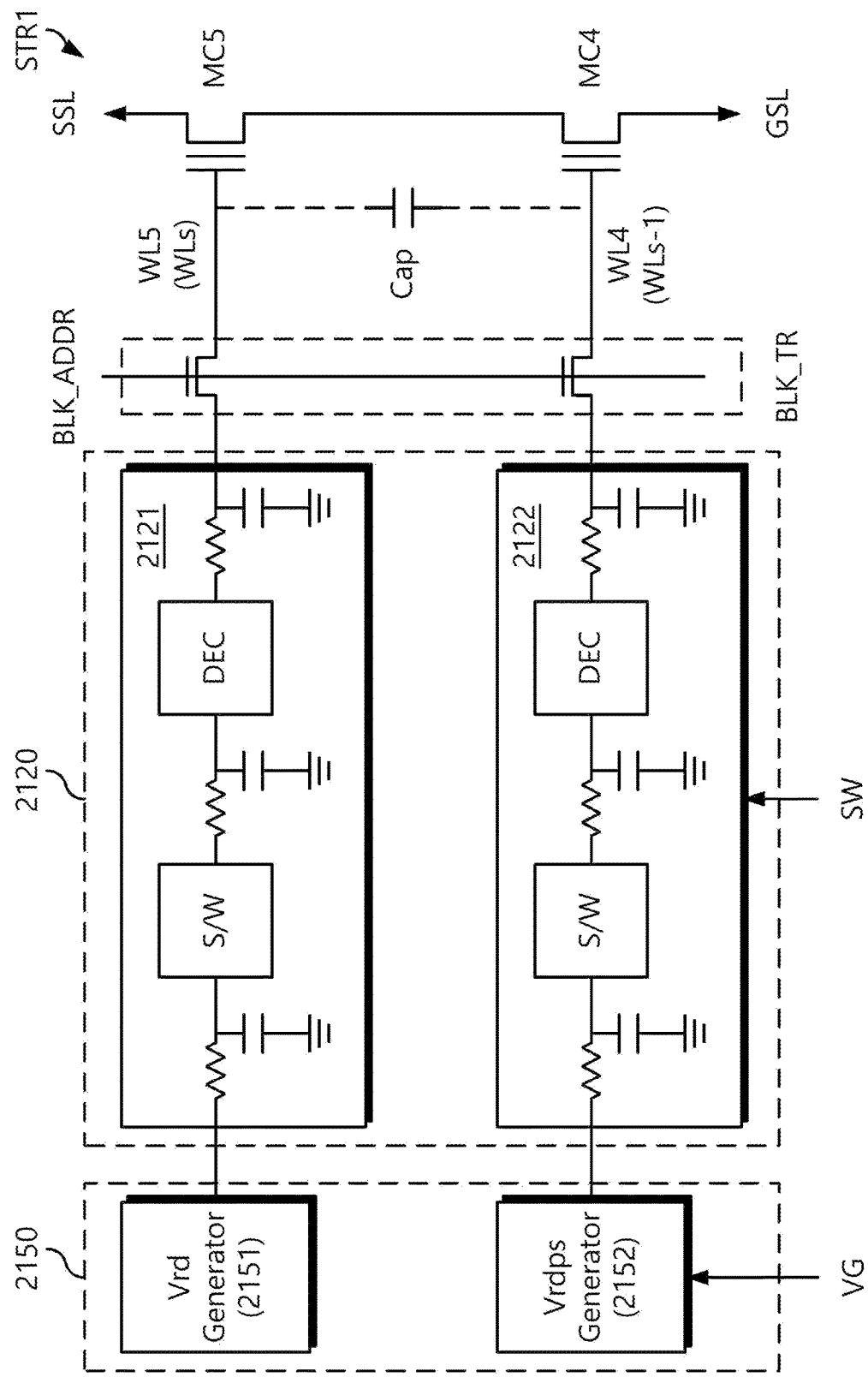
FIG. 8 is a block diagram illustrating a word line connect circuit of the flash memory shown in FIG. 4.

FIG. 8 is a block diagram illustrating a word line connect circuit of the flash memory shown in FIG. 4. Referring to FIG. 8, the word line connect circuit 2120 may be connected to the memory cells MC4 and MC5 through block select transistors BLK_TR. Here, the block select transistors BLK_TR may be controlled by a block select address BLK_ADDR. The block select address BLK_ADDR may be provided from the address ADDR shown in FIG. 4.

The word line connect circuit 2120 includes a selected word line connect circuit 2121 and an adjacent word line connect circuit 2122. The selected word line connect circuit 2121 is connected between the select read voltage generator 2151 and the block select transistor BLK_TR. The selected word line connect circuit 2121 applies the select read voltage Vrd to the select word line WLs (e.g., WL5) during a read operation. The adjacent word line connect circuit 2122 is connected between the read pass voltage generator 2152 and the block select transistor BLK_TR. The adjacent word line connection circuit 2122 may provide the read pass voltage Vrdps to the adjacent word lines WLs−1 (e.g., WL4) during a read operation.

The selected word line connect circuit 2121 and the adjacent word line connect circuit 2122 may include switch circuits S/W and decoders DEC. A resistance component and a capacitance component may exist in the signal line to which the switch circuits S/W and the decoders DEC are connected. One or more of the switch circuits S/W and the decoders (DEC) may exist, and the positions and orders thereof may be variously changed.

The switch circuit S/W of the adjacent word line connect circuit 2122 may include various switches connected between the read pass voltage generator 2152 and the block select transistor BLK_TR. For example, the switch circuit S/W may be configured as a switch transistor. The switch transistor may be turned on or off according to the switch signal SW applied to its gate. When the switch circuit S/W of the adjacent word line connect circuit 2122 is turned off, the adjacent word line WL4 may be cut off from the read pass voltage generator 2152 and enter a floating state.

The decoder DEC of the adjacent word line connect circuit 2122 may include various word line activation circuits connected between the read pass voltage generator 2152 and the block select transistor BLK_TR. For example, the decoder DEC may be a row decoder for activating one or more word lines among the word lines connected to the memory block BLK1. Alternatively, the decoder DEC may be a power line decoder for providing a word line voltage to one or more word lines. The decoder DEC deactivates the adjacent word line WL4 according to the switch signal SW and may put the adjacent word line WL4 into a floating state.

The flash memory 2100 may provide the select read voltage Vrd to the selected word line WLs and the read pass voltage Vrdps to the unselected word lines WLu during a read operation. When the voltage level of the selected word line WL5 is changed during the read operation, the flash memory 2100 uses the switch signal SW and the voltage generation signal VG to put the adjacent word line WL4 into a floating state. The flash memory 2100 may reduce a read voltage change time or a word line voltage setup time of the selected word line WL5 by using capacitive coupling.

Figure 9:
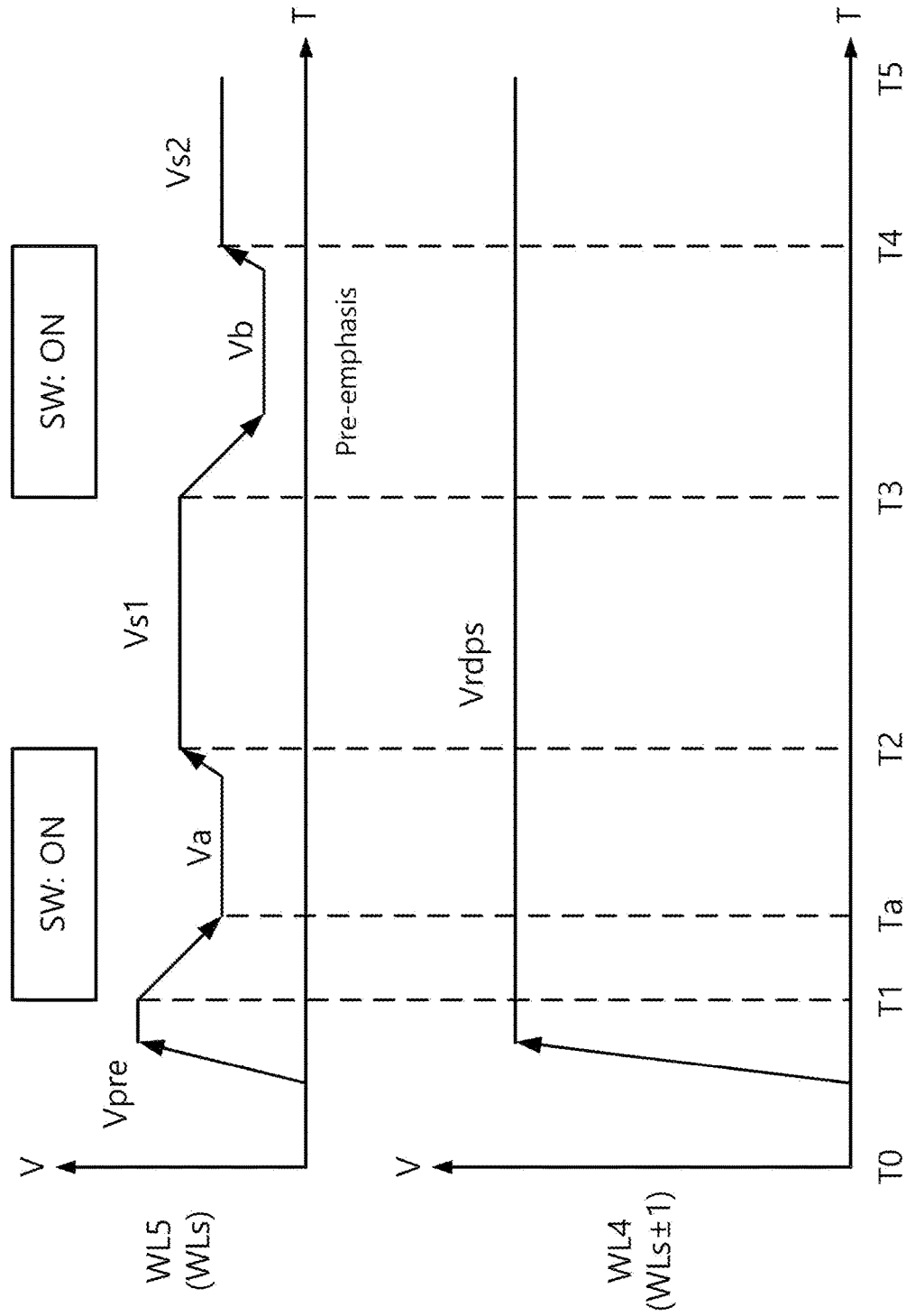
FIG. 9 is a timing diagram illustrating a read operation method when a switch signal is on in the word line connect circuit shown in FIG. 8.

FIG. 9 is a timing diagram illustrating a read operation method when a switch signal is ON in the word line connect circuit shown in FIG. 8. In the timing diagram, the horizontal axis is time T and the vertical axis is voltage V. FIG. 9 shows a case in which the switch signal SW is ON. When the switch signal SW is ON, the adjacent word lines WLs±1 are connected to the read pass voltage generator 2152.

Referring to FIG. 9, the read operation periods of the flash memory (see FIG. 4, 2100) includes a pre-pulse period (T0~T1), a first pre-emphasis period (T1~T2), a first read voltage period (Vs1, T2~T3), a second pre-emphasis period (T3~T4), a second read voltage period (Vs2, T4~T5) and the like. After the second read voltage period, the pre-emphasis period and the read voltage period may be repeated.

In the pre-pulse period T0 to T1, a pre-pulse voltage Vpre may be applied to the selected word line WLs. Here, the pre-pulse voltage may be the read pass voltage Vrdps or a voltage higher or lower than the read pass voltage Vrdps. For example, the flash memory 2100 may apply the pass read voltage Vrdps to all word lines at the start of the read operation, and then apply the select read voltage to the selected word line WLs.

A first pre-emphasis voltage Va may be applied during the first pre-emphasis period T1 to T2. The first pre-emphasis voltage Va may be lower than the pre-pulse voltage Vpre by a predetermined voltage level. The flash memory 2100 may apply the pre-pulse voltage Vpre and apply the first pre-emphasis voltage Va before applying the first voltage level Vs1. The first pre-emphasis voltage Va may be greater than a difference between the pre-pulse voltage Vpre and the first voltage level VS1. Here, Va>Vpre−Vs1. In this way, the flash memory 2100 may reduce a setup time of the selected word line WLs.

A read voltage of the first voltage level Vs1 may be applied during the first read voltage period T2 to T3. The first voltage level Vs1 may be any one of first to seventh select read voltages (refer to FIG. 7, Vrd1 to Vrd7). For example, the first voltage level Vs1 may be the seventh select read voltage Vrd7. The first voltage level Vs1 may be higher than the first pre-emphasis voltage Va and lower than the pre-pulse voltage Vpre. In the first read voltage period T2 to T3, first bit data among the multi-bit data stored in the selected memory cell MCs may be stored in a latch of the page buffer circuit 2130 (refer to FIG. 4).

A second pre-emphasis voltage Vb may be applied during the second pre-emphasis period T3 to T4. The second pre-emphasis voltage Vb may be lower than the first pre-emphasis voltage Va. The flash memory 2100 may apply the second pre-emphasis voltage Vb before applying the second voltage level Vs2. The second pre-emphasis voltage Vb may be greater than a difference between the first and second voltage levels Vs1 and Vs2. Here, Vb>Vs1−Vs2. In this way, the flash memory 2100 may reduce a setup time of the selected word line WLs.

The second voltage level Vs2 may be applied during the second read voltage period T4 to T5. The second voltage level Vs2 may be any one of first to sixth select read voltages (refer to FIG. 7, Vrd1 to Vrd6). For example, the second voltage level Vs2 may be the fourth select read voltage Vrd4. The second voltage level Vs2 may be higher than the second pre-emphasis voltage Vb and lower than the first voltage level Vs1. In the second read voltage period T4 to T5, second bit data among the multi-bit data stored in the selected memory cell MCs may be stored in a latch of the page buffer circuit 2130 (refer to FIG. 4).

The flash memory 2100 may provide an ON signal to the word line connection circuit 2120 (refer to FIG. 8) in the first and second pre-emphasis periods T1 to T2 and T3 to T4. When the ON signal is provided, as shown in FIG. 9, the flash memory 2100 may apply a biased read pass voltage (biased Vrdps) to the adjacent word lines WLs±1 during a read operation.

In the first pre-emphasis period T1 to T2, the read pass voltage Vrdps may be applied to the adjacent word lines WLs±1. In this case, the pre-pulse voltage Vpre may be changed to the first pre-emphasis voltage Va during the Ta-T1 time. Similarly, in the second pre-emphasis period T3 to T4, the first voltage level Vs1 may be changed to the second pre-emphasis voltage Vb for a predetermined time.

Figure 10:
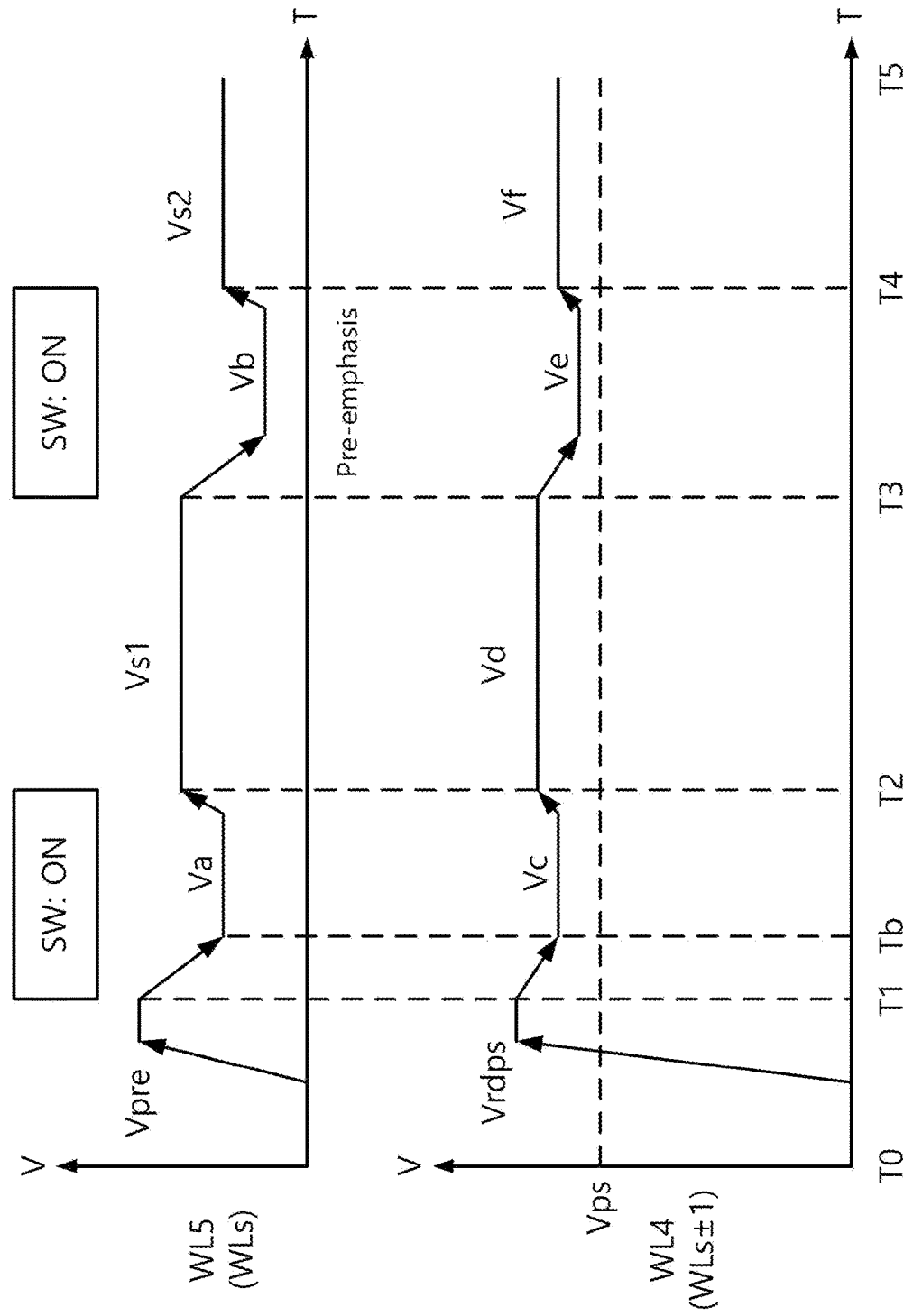
FIG. 10 is a timing diagram illustrating another embodiment of a read operation method when a switch signal is on in the word line connect circuit shown in FIG. 8.

FIG. 10 is a timing diagram illustrating another embodiment of a read operation method when a switch signal is ON in the word line connect circuit shown in FIG. 8. Referring to FIG. 10, the flash memory 2100 (refer to FIG. 4) may provide a waveform similar to the voltage applied to the selected word line WLs to the adjacent word lines WLs±1 during a read operation.

A Vc voltage level may be applied during the first pre-emphasis period T1 to T2. A Vd voltage level higher than the Vc voltage level may be applied during the first read voltage period T2 to T3. In the second pre-emphasis period T3 to T4, a Ve voltage level lower than the Vd voltage level may be applied. A Vf voltage level higher than the Ve voltage level may be applied during the second read voltage period T4 to T5. The voltage levels Vc to Vf applied to the adjacent word lines WLs±1 are voltages sufficient to turn on the memory cells connected to the unselected word lines WLu, and may be higher than the pass voltage (refer to FIG. 7, Vps).

According to the read method of the flash memory 2100 illustrated in FIG. 10, the coupling capacitance between the selected word line WLs and the adjacent word lines WLs±1 may be reduced. The flash memory 2100 may reduce the read voltage change time of the selected word line WLs by reducing the influence of the coupling capacitance during the read operation. In addition, when the voltage level of the selected word line WLs is rapidly changed, a hot carrier injection (HCI) phenomenon in adjacent memory cells may be effectively reduced.

In the first pre-emphasis period T1 to T2, the Vc voltage level may be applied to the adjacent word lines WLs±1. In this case, the pre-pulse voltage Vpre may be changed to the first pre-emphasis voltage Va during the time Tb-T1. The word line voltage change time Tb-T1 of FIG. 10 may be shorter than the word line voltage change time Ta-T1 of FIG. 9.

The read method of the flash memory 2100 illustrated in FIG. 10 may be performed by the eFuse register 2161 of the control logic 2160 illustrated in FIG. 4. The eFuse register 2161 may set parameters such that the voltages of the adjacent word lines WLs±1 are similar to the voltage waveform of the selected word line WLs. The e-fuse register 2161 may provide the voltage generation signal VG to the read pass voltage generator 2152 or the switch signal SW to the adjacent word line connect circuit 2122. The eFuse register 2161 may receive data for parameter setting from the eFuse block 2112 during a booting operation of the flash memory (refer to FIG. 4, 2100).

Figure 11:
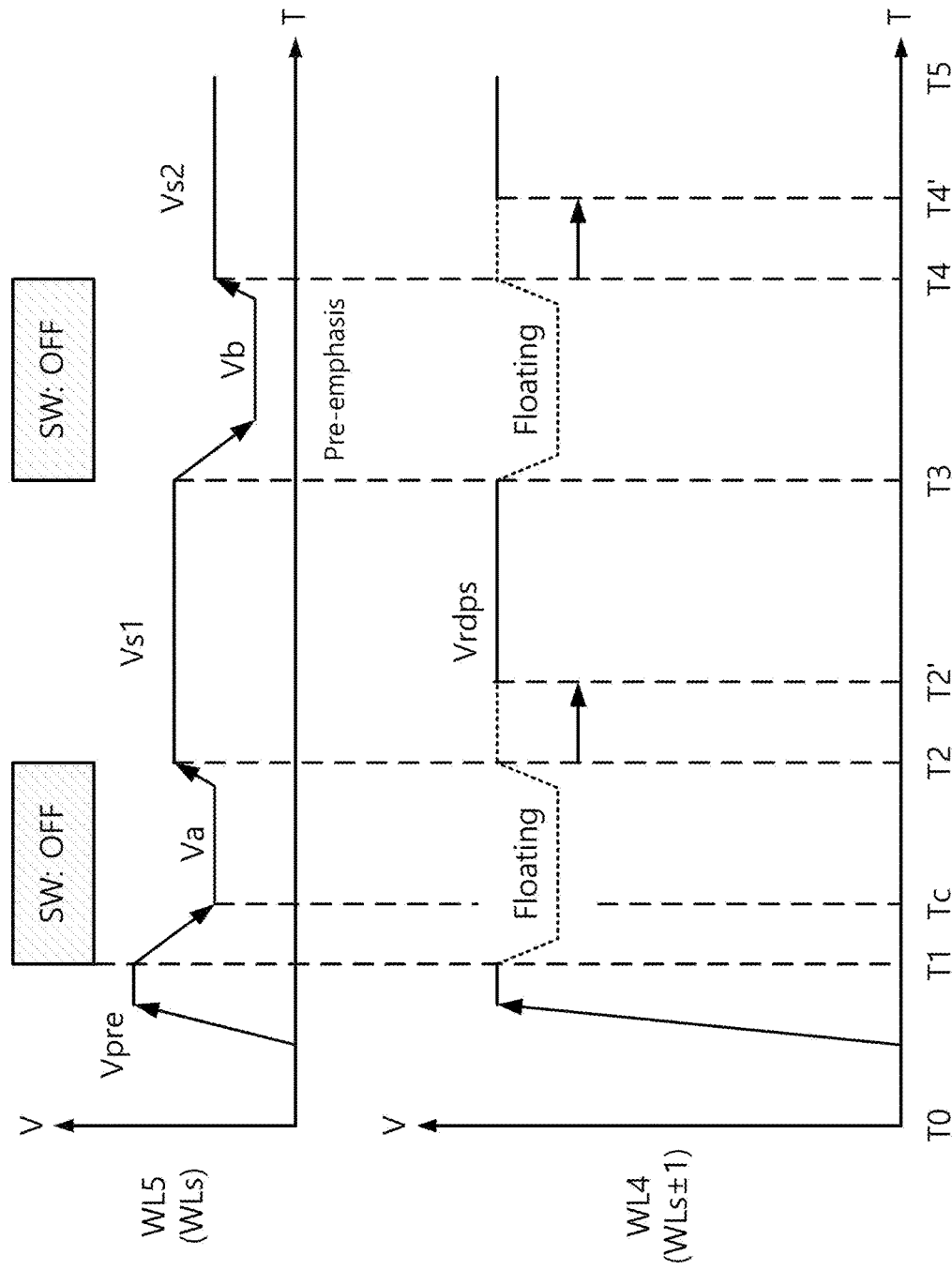
FIG. 11 is a timing diagram illustrating a read operation method when a switch signal is off in the word line connect circuit shown in FIG. 8.

FIG. 11 is a timing diagram illustrating a read operation method when a switch signal is OFF in the word line connect circuit shown in FIG. 8. When the switch signal SW is OFF, the adjacent word lines WLs±1 may be in a floating state. Referring to FIG. 11, in the first and second pre-emphasis periods T1 to T2 and T3 to T4, the adjacent word lines WLs±1 are in a floating state.

In the first pre-emphasis period T1 to T2, the voltage level of the selected word line WLs may be changed from the pre-pulse voltage Vpre to the first pre-emphasis voltage Va. In this case, the voltage of the adjacent word lines WLs±1 may have a waveform similar to the voltage of the selected word line WLs due to capacitive coupling. In the first pre-emphasis period T1 to T2, a voltage difference between the selected word line WLs and the adjacent word lines WLs±1 may be maintained similarly to the pre-pulse period T0 to T1.

Similarly, in the second pre-emphasis period T3 to T4, the voltage level of the selected word line WLs may be changed from the first voltage level Vs1 to the second pre-emphasis voltage Vb. In this case, the voltage of the adjacent word lines WLs±1 may be affected by capacitive coupling. At T4, when the switch signal SW is turned on, the adjacent word lines WLs±1 may become the pass read voltage Vrdps again.

In the first pre-emphasis period T1 to T2, the adjacent word lines WLs±1 may be in a floating state. During the time Tc-T1, the pre-pulse voltage Vpre may be changed to the first pre-emphasis voltage Va. The word line voltage change time Tc-T1 of FIG. 11 may be shorter than the word line voltage change time Ta-T1 of FIG. 9.

The flash memory 2100 may increase the floating time of the adjacent word lines WLs±1 in the first and second pre-emphasis periods T1 to T2 and T3 to T4. For example, the floating time of the adjacent word lines WLs±1 may be increased to T1 to T2' or T3 to T4', respectively.

Adjustment of the floating time of the adjacent word lines WLs±1 in the first and second pre-emphasis periods T1 to T2 may be performed through parameter setting of the eFuse register 2161 of the control logic (see FIG. 4, 2160). The control logic 2160 may adjust the off time of the adjacent word line voltage generator 2152 or the disconnecting time of the adjacent word line connect circuit 2122 by using the parameters set in the eFuse register 2161.

Figure 12:
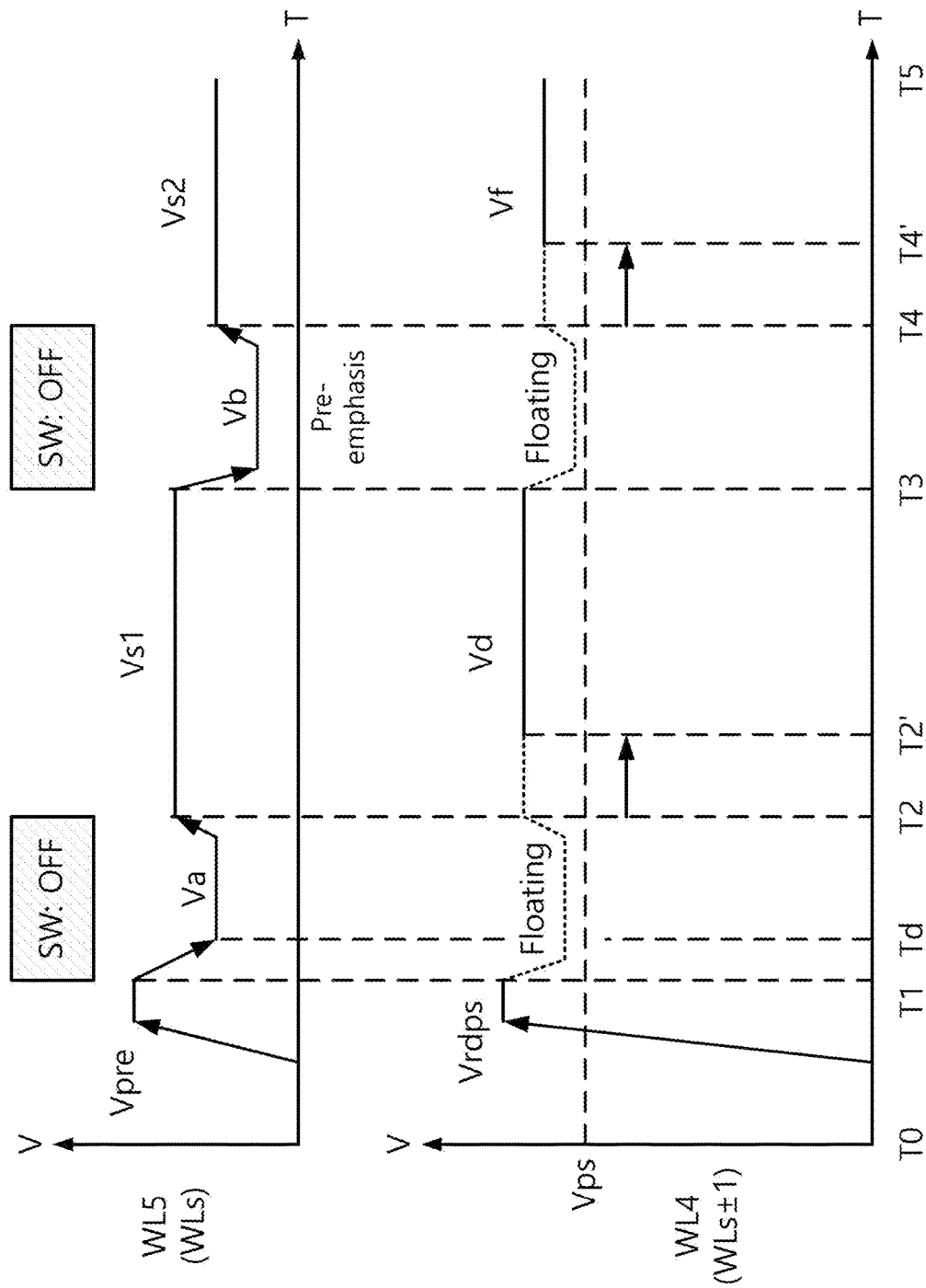
FIG. 12 is a timing diagram illustrating another embodiment of a read operation method when a switch signal is off in the word line connect circuit shown in FIG. 10.

FIG. 12 is a timing diagram illustrating a read operation method when a switch signal is OFF in the word line connect circuit shown in FIG. 10. When the switch signal SW is OFF, the adjacent word lines WLs±1 may be in a floating state. Referring to FIG. 12, in the first and second pre-emphasis periods T1 to T2 and T3 to T4, the adjacent word lines WLs±1 are in a floating state.

As described with reference to FIG. 10, the flash memory 2100 (refer to FIG. 4) may provide a waveform similar to the voltage applied to the selected word line WLs to the adjacent word lines WLs±1 during a read operation. In other words, a Vd voltage level lower than the read pass voltage Vrdps may be applied during the first read voltage period T2 to T3. A Vf voltage level lower than the Vd voltage level may be applied during the second read voltage period T4 to T5. The Vd and Vf voltage levels may be higher than the pass voltage (see FIG. 7, Vps).

In the first pre-emphasis period T1 to T2, when the switch signal SW is turned off, the adjacent word lines WLs±1 may be in a floating state. The voltage level of the selected word line WLs may be changed from the pre-pulse voltage Vpre to the first pre-emphasis voltage Va. The voltage of the adjacent word lines WLs±1 may have a waveform similar to the voltage of the selected word line WLs due to capacitive coupling. In the first pre-emphasis period T1 to T2, a voltage difference between the selected word line WLs and the adjacent word lines WLs±1 may be maintained similarly to the pre-pulse period T0 to T1.

In the second pre-emphasis period T3 to T4, when the switch signal SW is turned off, the adjacent word lines WLs±1 may be in a floating state. In this case, the voltage of the selected word line WLs may be changed from the first voltage level Vs1 to the second pre-emphasis voltage Vb. The voltage of the adjacent word lines WLs±1 may have a waveform similar to the voltage of the selected word line WLs due to capacitive coupling. In the second pre-emphasis period T3 to T4, a voltage difference between the selected word line WLs and the adjacent word lines WLs±1 may be maintained similar to that of the first read voltage period T2 to T3.

According to the read method of the flash memory 2100 illustrated in FIG. 12, the coupling capacitance between the selected word line WLs and the adjacent word lines WLs±1 may be reduced. Due to this, the flash memory 2100 may reduce a read voltage change time or a word line setup time of the selected word line WLs. In addition, the flash memory 2100 may effectively reduce the occurrence of the HCI phenomenon in adjacent memory cells when the voltage level of the selected word line WLs is rapidly changed.

In the first pre-emphasis period T1 to T2, the adjacent word lines WLs±1 may be in a floating state. During the time Td-T1, the pre-pulse voltage Vpre may be changed to the first pre-emphasis voltage Va. The word line voltage change time Td-T1 of FIG. 12 may be shorter than the word line voltage change time Ta-T1 of FIG. 9. The flash memory 2100 may increase the floating time of the adjacent word lines WLs±1 in the first and second pre-emphasis periods T1 to T2 and T3 to T4. For example, the floating time of the adjacent word lines WLs±1 may be increased to T1 to T2' or T3 to T4', respectively.

The read method of the flash memory 2100 illustrated in FIG. 12 uses a capacitive coupling phenomenon, and thus may be performed regardless of the eFuse register 2161 of the control logic 2160 illustrated in FIG. 4. The flash memory 2100 may generate a pre-emphasis effect in the floating adjacent word lines WLs±1 by using a capacitive coupling phenomenon. According to embodiments of the present disclosure, the pre-emphasis effect may be obtained without the parameter setting of the e-fuse register 2161, circuits, or elements. In addition, embodiments of the present disclosure may reduce the setup time of the selected word line WLs.

Figure 13:
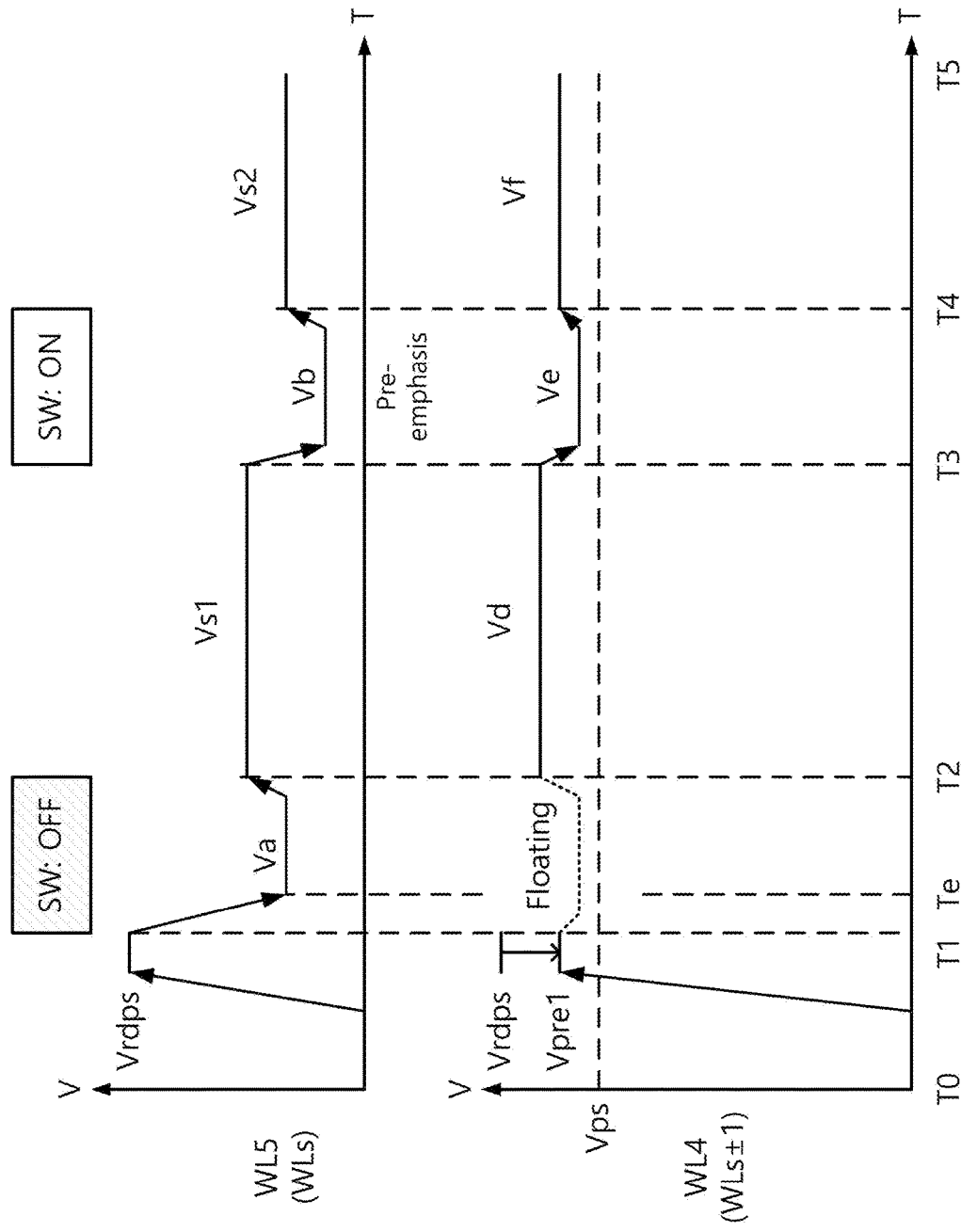
FIG. 13 is a timing diagram illustrating another embodiment of a read operation of the flash memory shown in FIG. 4.

FIG. 13 is a timing diagram illustrating another embodiment of a read operation of the flash memory shown in FIG. 4. FIG. 13 shows an example in which the switch signal SW is both OFF and ON in the read voltage changing period.

In the pre-pulse period T0 to T1, the read pass voltage Vrdps may be provided to the selected word line WLs. In this case, a first pre-pulse voltage Vpre1 lower than the read pass voltage Vrdps may be provided to the adjacent word lines WLs±1. The flash memory 2100 may apply the first pre-pulse voltage Vpre1 lower than the read pass voltage Vrdps. Due to the difference in setup time between the selected word line WLs and the adjacent word lines WLs±1 in the pre-pulse period T0 to T1, the overshoot in the adjacent word lines WLs±1 may be prevented from occurring. The flash memory 2100 may also suppress overshoot of the adjacent word lines WLs±1 due to a couple-up phenomenon between the selected word line WLs and the next adjacent word lines WLs±2.

In the first pre-emphasis period T1 to T2, the switch signal SW may be in an OFF state, and the adjacent word lines WLs±1 may be in a floating state. The flash memory 2100 may provide a waveform similar to the voltage applied to the selected word line WLs to the adjacent word lines WLs±1 using capacitive coupling during the first pre-emphasis period T1 to T2. In the second pre-emphasis period T3 to T4, the switch signal SW may be in an ON state. The adjacent word lines WLs±1 may be provided with a biased voltage Ve.

In the first pre-emphasis period T1 to T2, the adjacent word lines WLs±1 may be in a floating state. During the Te-T1 period, the first pre-pulse voltage Vpre1 may be changed to the first pre-emphasis voltage Va. The word line voltage change time Te-T1 of FIG. 13 may be shorter than the word line voltage change time Ta-T1 of FIG. 9.

The flash memory 2100 according to an embodiment of the present disclosure may put the adjacent word lines WLs±1 into a floating state or a bias state in the pre-emphasis period through the switch signal SW. The flash memory 2100 may use a capacitive coupling phenomenon to cause a pre-emphasis effect to occur in the floating adjacent word lines WLs±1. According to embodiments of the present disclosure, the pre-emphasis effect may be obtained and the setup time of the selected word line WLs may be reduced without a separate parameter setting of the eFuse register 2161 or a circuit or device.

The semiconductor memory device according to an embodiment of the present disclosure may put the adjacent word lines in a floating state while the read voltage level is changed. The adjacent word line voltage may have a similar waveform to the selected word line voltage due to capacitive coupling. According to embodiments of the present disclosure, it is possible to quickly change the read voltage level without using a separate eFuse. The setup time of the selected word line may be reduced.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A semiconductor memory device, comprising:
   first and second memory cells, wherein each of the first and second memory cells store multi-bit data;
   a first word line coupled to the first memory cell; and
   a second word line connected to the second memory cell and adjacent to the first word line;

wherein a period in which a first word line voltage for reading the multi-bit data stored in the first memory cell is applied comprises:
a first period in which a first voltage level is applied to the first word line to read a first bit of data from the multi-bit data stored in the first memory cell;
a second period in which a second voltage level lower than the first voltage level is applied to the first word line; and
a third period in which a third voltage level higher than the second voltage level is applied to the first word line to read a second bit of data from the multi-bit data stored in the first memory cell,
wherein in the second period, the second word line is in a floating state, and
wherein the period in which the first word line voltage is applied further comprises a pre-pulse period in which a pre-pulse voltage is applied to the first word line, wherein the pre-pulse period is before the first period.

2. The semiconductor memory device of claim 1, wherein the period in which the first word line voltage is applied further comprises a pre-emphasis period having a pre-emphasis voltage level lower than the first voltage level, wherein the pre-emphasis period is between the pre-pulse period and the first period.

3. The semiconductor memory device of claim 2, wherein in the pre-emphasis period, the second word line is in a floating state.

4. The semiconductor memory device of claim 3, wherein the second word line maintains the floating state for a period of time after the pre-emphasis period.

5. The semiconductor memory device of claim 1, further comprising:
one or more third word lines adjacent to the second word line; and
wherein in the second period, the third word lines are in a floating state.

6. The semiconductor memory device of claim 1, wherein the pre-pulse voltage is lower than the first voltage level.

7. The semiconductor memory device of claim 1, wherein a read pass voltage of the same level is applied to the second word line in the first and third periods.

8. The semiconductor memory device of claim 1, wherein read pass voltages of different levels are applied to the second word line in the first and third periods.

9. The semiconductor memory device of claim 1, wherein the second word line maintains the floating state for a period of time after the second period.

10. A semiconductor memory device, comprising:
first and second memory cells, wherein each of the first and second memory cells store multi-bit data;
a first word line coupled to the first memory cell;
a second word line connected to the second memory cell and adjacent to the first word line;
a voltage generator for generating a second word line voltage provided to the second word line; and
a word line connect circuit connected between the voltage generator and the second word line;
wherein a period in which a first word line voltage for reading the multi-bit data stored in the first memory cell is applied comprises:
a first period in which a first voltage level is applied to the first word line to read a first bit of data from the multi-bit data stored in the first memory cell;
a second period in which a second voltage level lower than the first voltage level is applied to the first word line; and
a third period in which a third voltage level higher than the second voltage level is applied to the first word line to read a second bit of data from the multi-bit data stored in the first memory cell,
wherein the second word line voltage provided to the second word line is cut off in the second period, and
wherein the first and second memory cells are flash memory cells.

11. The semiconductor memory device of claim 10, wherein the voltage generator is turned off in the second period.

12. The semiconductor memory device of claim 10, wherein the word line connect circuit is turned off in the second period.

13. The semiconductor memory device of claim 10, wherein the period in which the first word line voltage is applied further comprises:
a pre-pulse period in which a pre-pulse voltage is applied to the first word line, wherein the pre-pulse period is before the first period.

14. The semiconductor memory device of claim 13, wherein the period in which the first word line voltage is applied further comprises:
a pre-emphasis period having a pre-emphasis voltage level lower than the first voltage level, wherein the pre-emphasis period is between the pre-pulse period and the first period.

15. The semiconductor memory device of claim 14, wherein in the pre-emphasis period, the second word line voltage provided to the second word line is cut off.

16. The semiconductor memory device of claim 10, wherein read pass voltages of the same level or different levels are applied to the second word line in the first and third periods.

17. A method of operating a semiconductor memory device, the semiconductor memory device comprising first and second memory cells that each store multi-bit data, a first word line coupled to the first memory cell, and a second word line connected to the second memory cell and adjacent to the first word line, the method comprising:
applying a first voltage to the first word line to read a first bit of data from the multi-bit data stored in the first memory cell;
applying a second voltage lower than the first voltage to the first word line; and
applying a third voltage higher than a second voltage to the first word line to read a second bit of data from the multi-bit data stored in the first memory cell,
wherein the second word line is in a floating state when the second voltage is applied,
wherein the method further comprises:
applying a pre-pulse voltage to the first word line prior to applying the first voltage; and
applying a pre-emphasis voltage lower than the first voltage between applying the pre-pulse voltage and applying the first voltage,
wherein the second word line is in the floating state when the pre-emphasis voltage is applied.

* * * * *